United States Patent
Cummings et al.

(10) Patent No.: US 6,233,140 B1
(45) Date of Patent: May 15, 2001

(54) ELECTRICALLY CONDUCTIVE VIBRATION DAMPENER

(75) Inventors: John A. Cummings, Round Rock; Susan A. Yeager, Austin, both of TX (US)

(73) Assignee: Dell U.S.A., L.P., Round Rock, TX (US)

( * ) Notice: Subject to any disclaimer, the term of this patent is extended or adjusted under 35 U.S.C. 154(b) by 0 days.

(21) Appl. No.: 09/235,846

(22) Filed: Jan. 22, 1999

(51) Int. Cl.[7] .............................. G06F 1/16; H05K 5/06; H05K 7/20; H05K 9/00
(52) U.S. Cl. .................. 361/683; 361/812; 248/917; 345/905
(58) Field of Search ...................... 361/681–683, 361/807, 808, 812; 248/917; 345/905

(56) References Cited

U.S. PATENT DOCUMENTS

| | | | |
|---|---|---|---|
| 4,506,188 | * 3/1985 | Puhak . | |
| 5,115,104 | 5/1992 | Bunyan | 174/35 GC |
| 5,170,008 | 12/1992 | Evans et al. | 174/35 C |
| 5,351,176 | 9/1994 | Smith et al. | 361/681 |
| 5,358,412 | * 10/1994 | Maurinus et al. . | |
| 5,379,183 | 1/1995 | Okonsky et al. | 361/681 |
| 5,430,607 | 7/1995 | Smith | 361/683 |
| 5,491,892 | 2/1996 | Fritz et al. | 29/857 |
| 5,568,357 | * 10/1996 | Kochis et al. | 361/381 |
| 5,570,270 | * 10/1996 | Naedel et al. | 361/687 |
| 5,712,449 | 1/1998 | Miska et al. | 174/35 GC |
| 5,761,031 | 6/1998 | Ajmani | 361/685 |
| 5,765,819 | 6/1998 | Hummel | 267/153 |
| 5,831,816 | * 11/1998 | Johns et al. | 361/681 |
| 5,833,910 | 11/1998 | Teixido | 264/277 |
| 5,856,635 | 1/1999 | Fujisawa et al. | 174/153 G |

\* cited by examiner

Primary Examiner—Jeffrey Donels
(74) Attorney, Agent, or Firm—Skjerven Morrill MacPherson LLP; Marc R. Ascolese

(57) ABSTRACT

An electrically conductive vibration dampener is formed from an electrically conductive base, such as a piece of stamped metal, with at least one tab projecting from the base, and a dampening material member coupled to the base so that the tab can be oriented to provide electrical continuity between other conductors when the electrically conductive vibration dampener is installed into a device. The dampening material member is molded to the base, attached to the base with adhesive, or mechanically attached by for example, registering an edge of the base to a groove formed in the dampening material member. Additionally, the electrically conductive vibration dampener can include an aperture through which a fastener can pass, so that the electrically conductive vibration dampener can be used much like a grommet or washer when fastening components together.

28 Claims, 4 Drawing Sheets

ELECTRICALLY CONDUCTIVE VIBRATION DAMPENER

BACKGROUND OF THE INVENTION

1. Field of the Invention

This invention relates to vibration dampening devices and particularly to electrically conductive vibration dampening devices.

2. Description of the Related Art

Electronic devices, including desktop computer systems, portable computer systems (e.g., laptop computers, notebook computers, sub-notebook computers, and palmtops), personal digital assistants, and cellular telephones, typically have sensitive, and/or costly components that must be protected from harmful mechanical vibration and shock. For example, in notebook computers, one of the most expensive and fragile components is the flat panel display, typically a thin-film transistor liquid crystal display (TFT-LCD). Because the computer is designed to be portable, and the typical notebook computer has a clam-shell design, i.e. the flat panel display is located in one half of the clam-shell and is attached to the other half of the clam-shell (which contains other computer system components) by a hinge, the flat panel display can be subjected to a variety of harmful mechanical vibrations and stresses.

Consequently, such devices are typically assembled with some manner of vibration dampener to help protect the sensitive components. In computer systems with flat panel displays, the display is often attached to the remainder of the system with the help of a dampening device such as a rubber grommet. Additionally, many sensitive components, particularly flat panel displays, must also be electrically coupled to the remainder of the system in order to provide adequate grounding or proper continuity among electromagnetic interference (EMI) shielding devices. This is particularly important for flat panel displays which often include high frequency driving circuitry.

Given the high cost and sensitivity of many system components, and the costs associated with assembling such devices, it is desirable to have low-cost, simple, and easy to assemble parts to simultaneously provide vibration dampening and electrical continuity where needed. An example of a prior art device can be found in U.S. Pat. No. 5,761,031, entitled "Conductive Shock Mount for Reduced Electromagnetic Interference in a Disk Drive System," which teaches a rubber shock mount grommet coated with a conductive material such as metallic paint or a flexible metallic coating. However, such a device has a number of drawbacks including high cost, high resistance, cracking, and flaking of the conductive coating when the device is subjected to compression, as is often the case for a vibration dampening device. Flaking of the conductive coating is particularly undesirable in electronic devices where the conductive flakes migrate (e.g. because of transporting a portable device) to other areas in the computer system and cause electrical shorts. Additionally, flaking of the conductive coating can reduce the grommets effectiveness as an electrical conductor. Another prior art solution involves using separate vibration dampening grommets and EMI clips to provide electrical continuity. However, such a solution requires additional parts and complicates assembly of a computer system.

Accordingly, it is desirable to have a simple vibration dampening device that is electrically conductive, low cost, low resistance, easy to manufacture and use, and without the aforementioned disadvantages.

SUMMARY OF THE INVENTION

It has been discovered that an electrically conductive vibration dampener can be formed from an electrically conductive base, such as a piece of stamped metal, with at least one tab projecting from the base, and a dampening material member coupled to the base so that the tab can be oriented to provide electrical continuity between other conductors when the electrically conductive vibration dampener is installed into a device. The dampening material member can be molded to the base, attached to the base with adhesive, or mechanically attached by, for example, registering an edge of the base to a groove formed in the dampening material member. Additionally, the electrically conductive vibration dampener can include an aperture through which a fastener can pass so that the electrically conductive vibration dampener can be used much like a grommet or washer when fastening components together.

Accordingly, one aspect of the present invention provides an electrically conductive vibration dampener including an electrically conductive base and a dampening material member coupled to the base. The electrically conductive base has a first surface and an opposing second surface, and includes including at least one tab. The dampening material member is coupled to the base so as to be at least partially located on the first surface of the base. The at least one tab is located so that when the electrically conductive vibration dampener is installed in a device, the at least one tab is part of an electrically conductive path between a first conductor and a second conductor in the device.

In another aspect of the invention, a computer system includes a processor, a memory coupled to the processor, a chassis supporting the processor and memory, a flat panel display secured to the chassis with a fastener, and an electrically conductive vibration dampener located between the flat panel display and the chassis. The electrically conductive vibration dampener includes an electrically conductive base and a dampening material member coupled to the base. The electrically conductive base has a first surface and an opposing second surface, and includes including at least one tab. The dampening material member is coupled to the base so as to be at least partially located on the first surface of the base. The at least one tab making electrical contact with at least one of a chassis conductor and a flat panel display conductor.

In still another aspect of the invention, an electrically conductive vibration dampener includes a means for conducting electricity including at least one contact means, and a means for dampening vibration coupled to the means for conducting electricity. The at least one contact means being located so that when the electrically conductive vibration dampener is installed in a device, the at least one contact means is part of an electrically conductive path between a first conductor and a second conductor in the device.

BRIEF DESCRIPTION OF THE DRAWINGS

The present invention may be better understood, and its numerous objects, features, and advantages made apparent to those skilled in the art by referencing the accompanying drawings

DETAILED DESCRIPTION

Figure 1A:
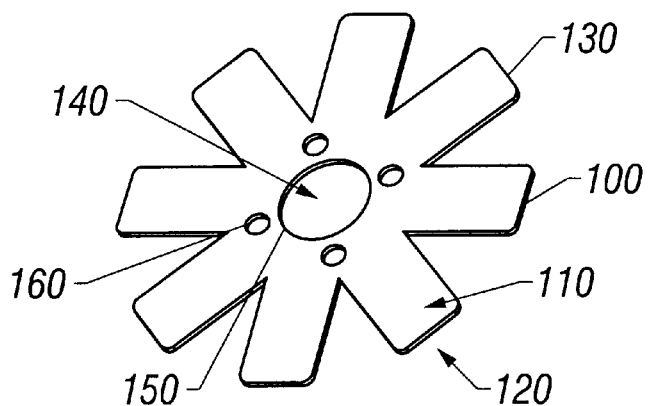
FIGS. 1A–1C illustrate the base, the dampening material member, and a cross-sectional view of an electrically conductive vibration dampener.

FIG. 1 shows an electrically conductive base 100 for an electrically conductive vibration dampener. The base has top and bottom surfaces 110 and 120, respectively, and is typically formed from a sheet of metal, thereby making the base substantially flat, although the base can be formed from a variety of materials and take a variety of shapes. Base 100 includes a plurality of tabs 130 that are attached to, or as shown, integrally formed from the base. Additionally, the electrically conductive base includes a base aperture 140 (having an inner edge 150) to allow the electrically conductive vibration dampener to be fitted around the shaft of a fastener, such as a screw. Molding apertures 160 are located on portions of base 100 where dampening material is molded to the base, and allow the dampening material to flow from one surface of the base to the other, thereby facilitating coupling of the dampening material member to the base.

Figure 1B:
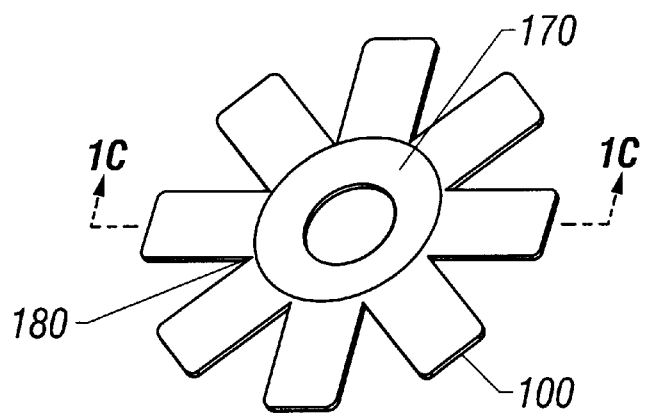
Figure 1C:
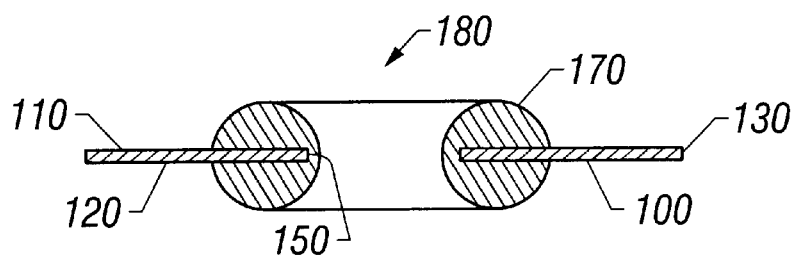

FIG. 1B shows electrically conductive base 100 with a dampening material member 170 molded to the base. In the example shown, dampening material member 170 is generally annular-shaped, and is formed from a thermoplastic elastomer. As shown, the dampening material member does not extend to the common points 180 between adjacent tabs, but in other embodiments the dampening material member can extend beyond these points to enhance molding to the base much in the same way as molding apertures 160 facilitate molding. FIG. 1C shows the cross-section of the electrically conductive vibration dampener labeled 1C in FIG. 1B. Dampening material member 170 partially extends into aperture 140 and around inner edge 150 to form a dampening material member aperture 180. By extending around inner edge 150, the molded dampening material member is more securely coupled to base 100. However, the dampening material member need not extend into the base aperture 140, particularly if the material comprising the dampening material member can flow through molding apertures 160, or extend beyond points 180.

Electrically conductive base 100 is preferably formed form a single metal or metal alloy, examples of which include aluminum, steel, stainless steel, copper, brass, and beryllium copper. Additionally, base 100 can be formed from a non-metallic material (e.g., plastic) with a metallic coating. Although eight tabs are illustrated in FIGS. 1A–1B, the base can have as few as one tab. Those having ordinary skill in the art will readily recognize that a variety of tab shapes and sizes can be implemented, and the tabs need not be formed radially from the center of the base as illustrated. Molding apertures and base apertures may or may not be implemented depending on the needs of the device for which the electrically conductive vibration dampener is used and the manner in which the dampening material member is coupled to the base. For example, a conductive base similar to that shown in FIG. 1A could be used with or without molding apertures 160 if the dampening material member was formed from two separate pieces, each coupled to opposite sides of the base with an adhesive. In another example, the dampening material member could be formed separately from the base (e.g, a grommet) and include a groove around the periphery of the dampening material member so that it could be inserted into the aperture of the base with the inner edge of the base held in the groove. The dampening material member is formed from a material sufficiently resilient for the desired level of vibration dampening, such as, for example, elastomers, rubber, plastics, and resins. Hardness and or resilience of rubber and rubber-like materials can be measured by a durometer, and those having ordinary skill in the art will readily recognize a variety of ways in which to determine whether a material is appropriate for a specific application, as well as what hardness qualities are desirable when choosing a particular material.

Figure 2A:
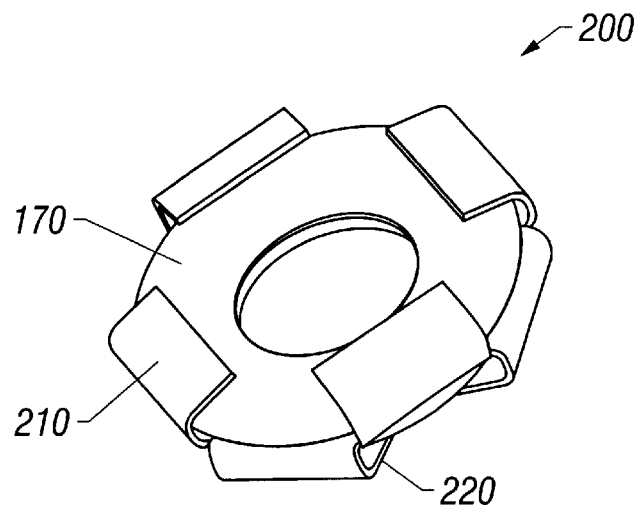
FIGS. 2A–2B illustrate an electrically conductive vibration dampener in its final form.
Figure 2B:
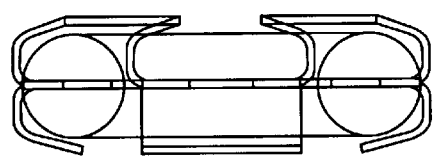

FIGS. 2A and 2B illustrate the electrically conductive vibration dampener 200 in its final form. Tabs 130 are alternately bent up and over the top portion of the dampening material member (210) and down and under the bottom portion of the dampening material member (220). The tabs can be oriented in a variety of ways depending on, for example, the number of tabs in the base, the desired orientation for the electrically conductive vibration dampener in the device for which it is used, and the size of the tabs. If only one tab was formed in the base, it could be stamped so that it is long enough to be bent completely over the top portion of the dampening material member and then back under the bottom portion of the dampening material member. In that example, it may be desirable to include apertures in the tab itself that would line up with the central aperture illustrated.

Figure 3:
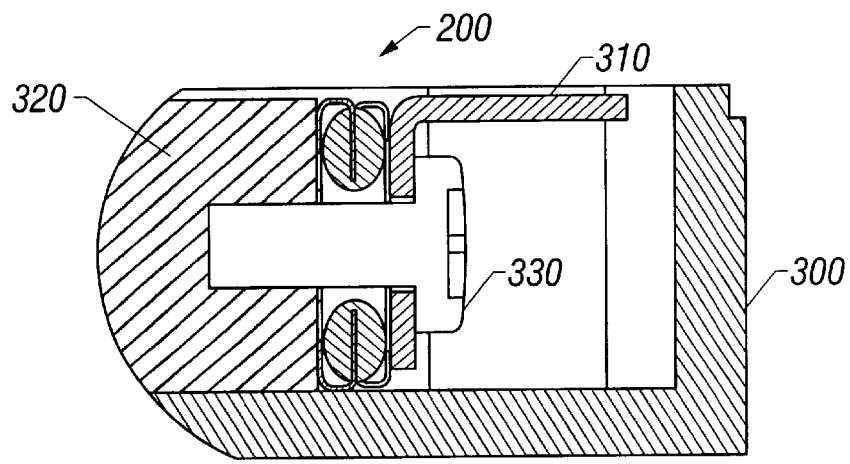
FIG. 3 is a cross-sectional view of the electrically conductive vibration dampener of FIGS. 2A–2B installed in a device.

Electrically conductive vibration dampener 200 is shown installed into a display assembly of a notebook computer in FIG. 3. Fastener 330 secures LCD panel 320 to retention bracket 310 (all located near display back cover 300) which is then attached to some other portion of the notebook computer. Electrically conductive vibration dampener 200 is located between bracket 310 and LCD panel 320 to protect the LCD panel from vibrations transmitted through the bracket. Additionally, the tabs of the electrically conductive vibration dampener are located to provide electrical continuity between bracket 310 and a metallic frame or tray (not shown) attached to LCD panel 320. Note that the dampening material member is shown compressed (i.e., pre-loaded) by the fastener securing the LCD panel to the bracket. Depending upon the desired amount of vibration dampening, and the material properties of the dampening material member, the fastener may be more tightly or loosely secured to LCD panel 320, and thus dampening material member may be compressed more or less than shown.

Figure 4:
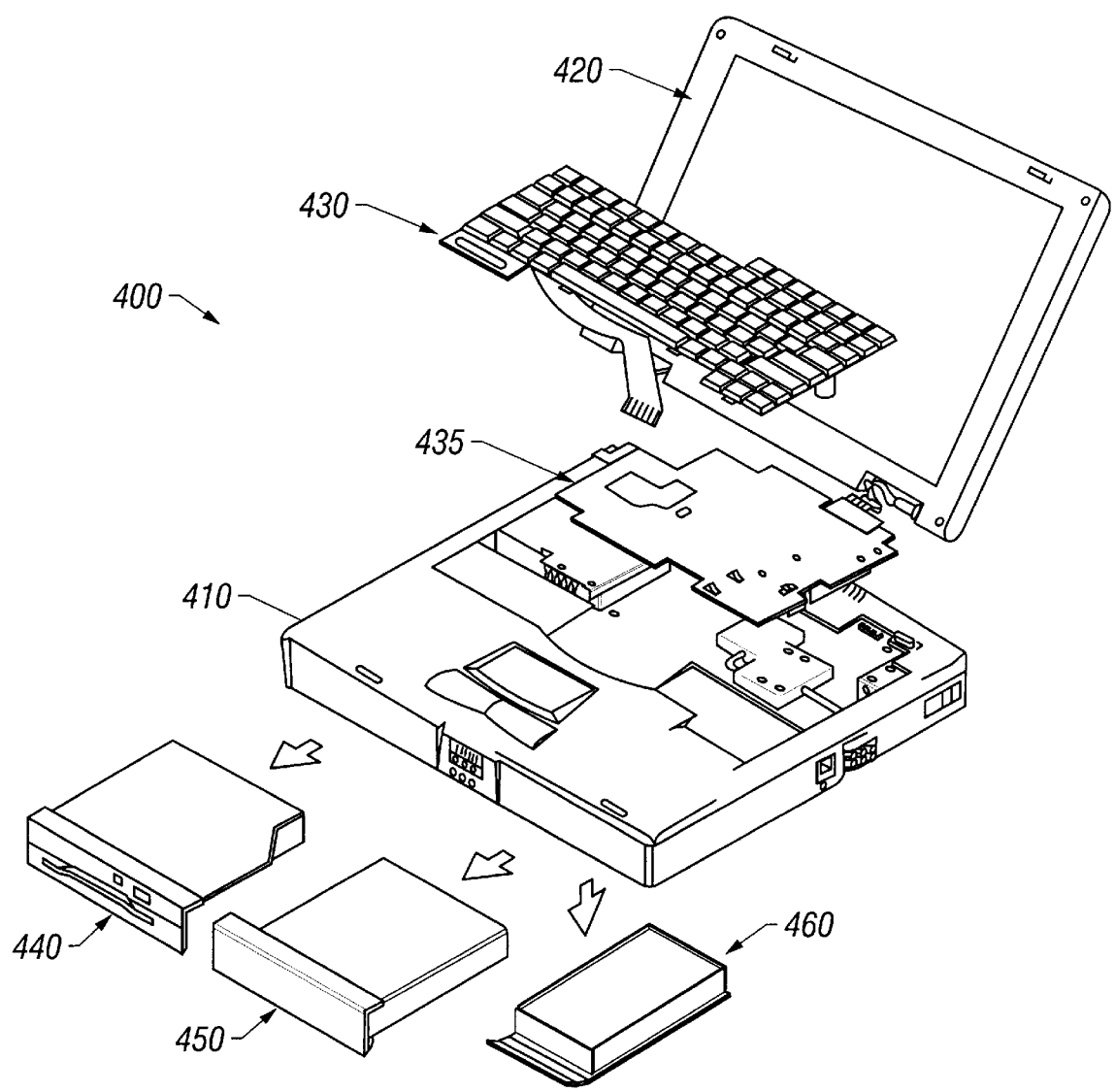
FIG. 4 illustrates a notebook computer system that includes an electrically conductive vibration dampener.

FIG. 4 illustrates an exploded view of a typical notebook computer system 400 in which electrically conductive vibration dampener 200 is used. Main chassis 410 supports many of the computer system components including a motherboard with a processor and memory (not shown), flat panel display assembly 420 (typically attached to the main chassis through hinges), keyboard 430, thermal shield 435, CD-ROM and floppy disk drive 440, rechargeable battery 450, and hard disk drive 460. Those having ordinary skill in the art will readily recognize that FIG. 4 illustrates only one of many possible computer systems, and that the computer systems can include a variety of other components including storage devices, communications devices, input devices, and output devices.

Figure 5:
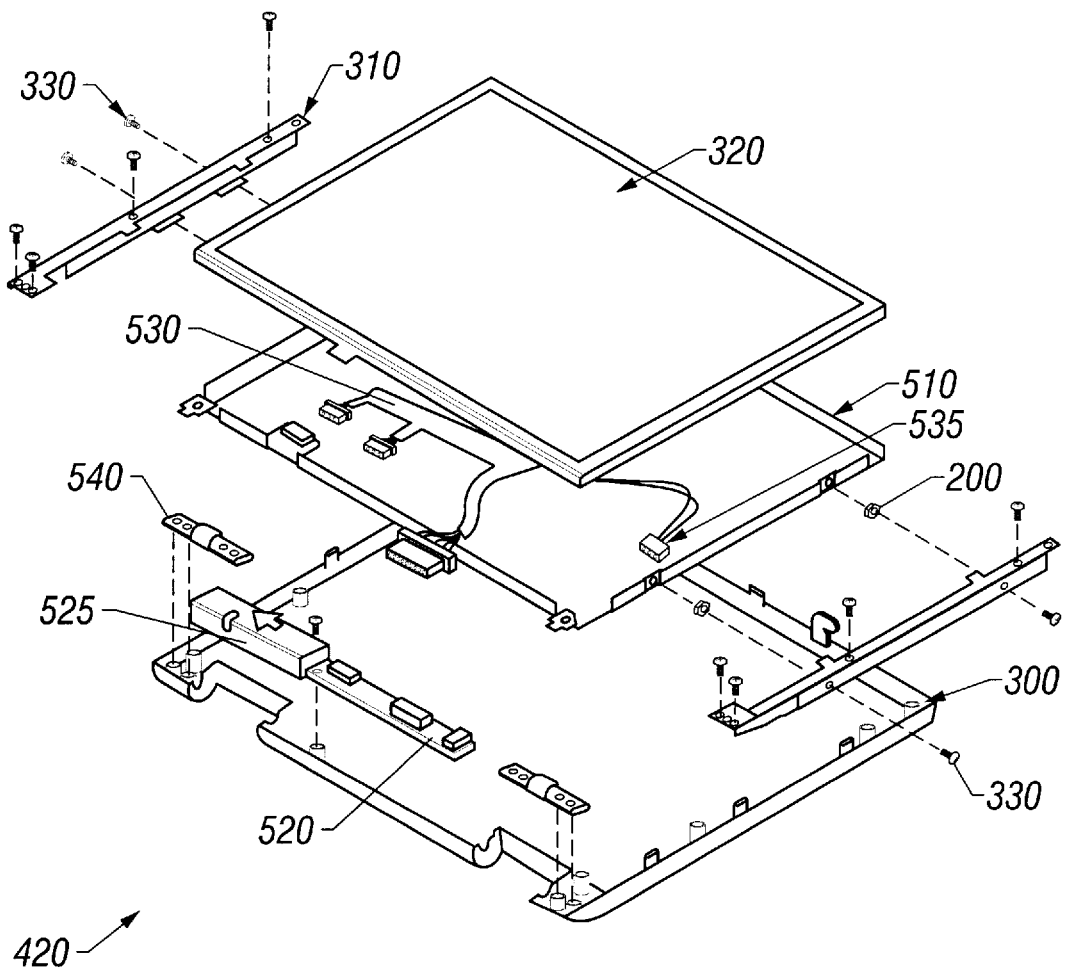
FIG. 5 is an exploded view of the display assembly of the notebook computer system of FIG. 4 showing the electrically conductive vibration dampener.

FIG. 5 shows display assembly 420 and its various components. Back cover 300 supports most of the components illustrated. Retention brackets 310 are fastened to back cover 300 and additionally fastened to LCD panel 320 through electrically conductive vibration dampeners 200 and LCD panel carrier tray 510 with fasteners 330. Note that at some points along retention brackets 310, the brackets are secured to back cover 300 through hinges 540. Hinges 540, in turn, are attached to main chassis 410. The display assembly includes display circuitry 520, circuitry shielding 525, and cabling 530 with connectors 535. Electrically conductive vibration dampeners 200 provide electrical continuity between carrier tray 510 and retention brackets 310, so that a conductive path exists between, at least, the carrier tray and some portion of main chassis 410 (through hinges 540).

As illustrated in FIGS. 3–5, the electrically conductive vibration dampener can be used to mount flat panel displays including, for example, backlit LCDs, active matrix LCDs, passive matrix LCDs, thin film transistor (TFT) LCDs, touch sensitive LCDs, electroluminescent displays, field emission displays, and plasma displays. The electrically conductive vibration dampener can also be used for mounting other electronic components in a computer system, such as a hard disk drive. In general, the electrically conductive vibration dampener can be used wherever vibration dampening and maintaining electrical continuity are needed.

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. An electrically conductive vibration dampener comprising:
    an electrically conductive base having a first surface and an opposing second surface, the base including at least one tab; and
    a dampening material member coupled to the base so as to be at least partially located on the first surface of the base; the at least one tab being located so that when the electrically conductive vibration dampener is installed in a device, the at least one tab is part of an electrically conductive path between a first conductor and a second conductor in the device.

2. The electrically conductive vibration dampener of claim 1 wherein the at least one tab is oriented to extend over the dampening material member such that a portion of the dampening material member is located between the at least one tab and another portion of the base.

3. The electrically conductive vibration dampener of claim 1 wherein the at least one tab is a plurality of tabs.

4. The electrically conductive vibration dampener of claim 1 wherein the dampening material member is coupled to the base so as to be at least partially located on the first surface and the second surface of the base.

5. The electrically conductive vibration dampener of claim 1 wherein the dampening material member is coupled to the base with an adhesive.

6. The electrically conductive vibration dampener of claim 1 wherein the base includes an aperture extending from the first surface to the second surface and having an aperture inner edge, and wherein the dampening material member includes a groove extending around a periphery of the dampening material member, the groove for supporting the inner edge of the aperture.

7. The electrically conductive vibration dampener of claim 6 wherein the dampening material member is a grommet.

8. The electrically conductive vibration dampener of claim 1 wherein the dampening material member is molded onto the base so as to be at least partially located on the first surface and the second surface of the base.

9. The electrically conductive vibration dampener of claim 8 wherein the base includes an aperture extending from the first surface to the second surface and having an aperture inner edge, the dampening material member being molded around the aperture inner edge and including a dampening material member aperture at least partially coextensive with the base aperture.

10. The electrically conductive vibration dampener of claim 9 wherein the base includes a molding aperture extending from the first surface to the second surface, the a portion of the dampening material member extending through the molding aperture.

11. The electrically conductive vibration dampener of claim 8 wherein:
    the at least one tab is a plurality of tabs;
    a first tab of the plurality of tabs is oriented to extend over the dampening material member such that a first portion of the dampening material member is located between the first tab and the first surface of the base; and
    a second tab of the plurality of tabs is oriented to extend over the dampening material member such that a second portion of the dampening material member is located between the second tab and the second surface of the base.

12. The electrically conductive vibration dampener of claim 1 wherein the dampening material member is formed from one of elastomer, rubber, plastic, and resin.

13. The electrically conductive vibration dampener of claim 1 wherein the conductive base is formed from one of a metal and a plastic coated with an electrically conductive material.

14. A computer system comprising:
    a processor;
    a memory coupled to the processor;
    a chassis supporting the processor and memory;
    a flat panel display secured to the chassis with a fastener; and
    an electrically conductive vibration dampener located between the flat panel display and the chassis, the electrically conductive vibration dampener comprising:
        an electrically conductive base having a first surface and an opposing second surface, the base including at least one tab; and
        a dampening material member coupled to the base so as to be at least partially located on the first surface of the base; the at least one tab making electrical contact with at least one of a chassis conductor and a flat panel display conductor.

15. The computer system of claim 14 wherein the chassis includes flat panel display retention bracket which serves as the chassis conductor, the fastener coupling the flat panel display to the flat panel display retention bracket.

16. The computer system of claim 14 wherein the flat panel display conductor is one of a flat panel display frame and a flat panel display carrier tray.

17. The computer system of claim 14 wherein the at least one tab is oriented to extend over the dampening material member such that a portion of the dampening material member is located between the at least one tab and another portion of the base.

18. The computer system of claim 14 wherein the dampening material member is coupled to the base so as to be at least partially located on the first surface and the second surface of the base.

19. The computer system of claim 14 wherein the base includes an aperture extending from the first surface to the second surface and having an aperture inner edge, and wherein the dampening material member includes a groove extending around a periphery of the dampening material member, the groove for supporting the inner edge of the aperture.

20. The computer system of claim 14 wherein the dampening material member is molded onto the base so as to be at least partially located on the first surface and the second surface of the base.

21. The computer system of claim 20 wherein the base includes an aperture extending from the first surface to the second surface and having an aperture inner edge, the dampening material member being molded around the aperture inner edge and including a dampening material member aperture at least partially coextensive with the base aperture, the fastener passing through the dampening material member aperture.

22. The computer system of claim 20 wherein:

the at least one tab is a plurality of tabs;

a first tab of the plurality of tabs is oriented to extend over the dampening material member such that a first portion of the dampening material member is located between the first tab and the first surface of the base; and a second tab of the plurality of tabs is oriented to extend over the dampening material member such that a second portion of the dampening material member is located between the second tab and the second surface of the base.

23. An electrically conductive vibration dampener comprising:

a means for conducting electricity including at least one contact means; and a means for dampening vibration coupled to the means for conducting electricity; the at least one contact means being located so that when the electrically conductive vibration dampener is installed in a device, the at least one contact means is part of an electrically conductive path between a first conductor and a second conductor in the device.

24. The electrically conductive vibration dampener of claim 23 wherein the means for dampening vibration is molded to the means for conducting electricity and the at least one contact means protrudes from the means for dampening vibration.

25. The electrically conductive vibration dampener of claim 24 wherein the means for dampening vibration is formed from one of elastomer, rubber, plastic, and resin.

26. The electrically conductive vibration dampener of claim 23 wherein the at least one contact means is oriented so that at least a portion of the means for dampening vibration is located between the at least one contact means and another portion of the means for conducting electricity.

27. The electrically conductive vibration dampener of claim 23 further comprising a fastener aperture through which at least a portion of a fastener can pass.

28. The electrically conductive vibration dampener of claim 23 wherein the means for conducting electricity is formed from a substantially flat piece of one of metal and plastic coated with an electrically conductive material.

* * * * *